United States Patent [19]

Howell et al.

[11] 3,779,927

[45] Dec. 18, 1973

[54] HEAT TRANSFER AGENT COMPOSITION

[75] Inventors: Edward R. Howell, Freeport; Harold B. Wood, Jr., Lake Jackson, both of Tex.; Richard S. Sayad, Midland, Mich.

[73] Assignee: The Dow Chemical Company, Midland, Mich.

[22] Filed: Apr. 26, 1971

[21] Appl. No.: 137,589

Related U.S. Application Data

[63] Continuation-in-part of Ser. No. 766,979, Oct. 11, 1968, abandoned.

[52] U.S. Cl. .................. 252/75, 117/102 R, 252/70, 252/DIG. 1

[51] Int. Cl. .................. C09k 3/02

[58] Field of Search .................. 252/70, DIG. 1, 193, 252/75; 260/584 B

[56] References Cited

UNITED STATES PATENTS

| | | | |
|---|---|---|---|
| 3,005,776 | 10/1961 | Langer et al. | 252/75 X |
| 3,022,335 | 2/1962 | Lundsted | 260/584 B X |
| 3,117,999 | 1/1964 | Boettner et al. | 260/584 B |
| 3,118,000 | 1/1964 | Dupré et al. | 260/584 B |

*Primary Examiner*—Richard D. Lovering
*Attorney*—Griswold & Burdick, L. Wayne White and C. E. Rehberg

[57] ABSTRACT

Amine-initiated copolymers of ethylene oxide and propylene oxide containing a small but effective amount of an alkaline pH buffering agent are effective heat transfer agents in the removal of excess solder from electronic circuit boards.

12 Claims, No Drawings

HEAT TRANSFER AGENT COMPOSITION

CROSS-REFERENCE TO RELATED APPLICATION

This application is a continuation-in-part of our copending application filed Oct. 11, 1968, Ser. No. 766,979, now abandoned.

BACKGROUND OF THE INVENTION

The methods of preparing electronic circuit boards are known. A typical preparation comprises the steps of plating the board with a metal, such as copper, photographically etching the desired circuit pattern onto the metal, masking the etched portion against attack by acid, exposing the board surface to an acid bath until the unmasked portion of the metal is dissolved, removing the masking material, exposing the board to an acid flux, dipping the board into a solder bath, removing the board from the proximity of the bath and allowing the solder to harden.

Several technical problems are inherent in the preparation of circuit boards, or cards, one of which is that dipping the circuit board into the solder bath generally results in a large amount of solder adhering to and protruding beyond the plane of the circuit board.

It is desirable that the amount of solder retained by the finished circuit board be kept to a minimum, i.e. that amount necessary to form a continuous, conductive metal lattice traversing the desired points of electrical conduction, for a number of obvious reasons, not the least of which is economics.

Removal of the excess solder, i.e. that amount of solder beyond the minimum described above, has been accomplished in the past by exposing the surface of the circuit board containing the excess solder to a heat transfer agent at a temperature above the melting point of the solder and maintaining such contact until the excess solder melts off, e.g. in removal of tin-lead solder the temperature is maintained at 400°–450°F. Such methods of exposure include the technique of directing a stream of spray of the heat transfer agent onto the board surface, and also dipping the circuit board into a hot bath of the heat transfer agent.

The heat transfer agents used in the past for removing excess solder, e.g. mineral oil, peanut oil, etc., have not been entirely satisfactory because at the severe conditions of use, i.e. high temperatures and increasingly acidic conditions, they have degraded more or less rapidly. By degradation is meant that the heat transfer agents have been oxidized and broken down in molecular structure. Degraded heat transfer agents generally have an objectionable odor and/or smoke associated with them as well as a high weight loss, due to evaporation of the lower molecular weight components. The degraded heat transfer agents also have a tendency to discolor the boards, which are generally of polyester, phenolic resin or epoxy resin composition and may be reinforced with glass fibers.

SUMMARY OF THE INVENTION

It has now been discovered that water-soluble amine-initiated copolymers of ethylene oxide and propylene oxide containing a small but effective amount of an alkaline pH buffering agent are very effective heat transfer agents in the removal of excess solder from electronic circuit boards. The use of such copolymers as the heat transfer agent represents a definite improvement in the method of removing excess solder.

The copolymers of this invention are thermally stable, water-soluble materials which are liquid at temperatures between about room temperature and about 500°F. The copolymers contain the —$C_2H_4O$— and —$CH(CH_3)CH_2O$— moieties in a weight ratio between about 50/50 and about 85/15 respectively. Such moieties may be present in the copolymer in a random order, i.e. a heteropolymer, or in an orderly repeating fashion, i.e. a block copolymer. The average molecular weight of the copolymers is typically from about 1,000 to about 10,000 and is preferably from about 1,000 to about 5,000 and is most preferably from about 2,500 to about 4,000.

The presence of an alkaline pH buffering agent in the ethylene oxide (EO) and propylene oxide (PO) copolymer is essential to prevent development of free acidity. By an "alkaline pH buffering agent" is meant salt(s) generally formed by reacting a strong base (e.g. alkali metal oxides and hydroxides) with a weak mono- or polybasic acid (such as acetic, propionic, citric, oxalic, boric, metaboric, carbonic, and phosphoric acids and the like). Such buffering agents are capable of neutralizing strong acids (e.g. HCl, $H_2SO_4$, and the like) and are generally solids which have only a limited solubility in the EO/PO copolymer. Accordingly, the pH buffering agent is admixed with the EO/PO copolymer in a manner such that a suspension of finely divided particles of the buffering agent in the copolymer is attained. This result is conveniently achieved by shear-mixing or ball-milling the buffering agent into the liquid copolymer, or by reacting a weak mono- or polybasic acid with the basic catalyst present in the EO/PO copolymer to thereby generate the buffering agent in situ. The latter procedure is preferred.

The alkaline pH buffering agents useful herein are a known class of compounds. Examples of suitable such buffering agents include inorganic compounds (such as the alkali metal carbonates, phosphates, borates, and the like) and organic compounds (such as the alkali metal acetates, propionates, oxalates, malonates, succinates, phthalates, citrates, tartrates, and the like), and mixtures of such agents; e.g. $Na_2CO_3$, $NaHCO_3$, $K_2CO_3$, $KHCO_3$, $Na_3PO_4$, $Na_2HPO_4$, $K_3PO_4$, $K_2PO_4$, borax, potassium tetraborate, sodium boroformate, sodium acetate, potassium propionate, sodium oxalate, potassium malonate, sodium succinate, sodium phthalate, potassium isophthalate, sodium terephthalate, potassium hydrogen terephthalate, sodium citrate, sodium tartrate, etc. The sodium and potassium carbonates and phosphates are the preferred buffering agents with $Na_3PO_4$ and $K_3PO_4$ being most preferred. Amounts of buffering agent of up to about 5 percent by weight, total weight basis, are generally sufficient. More can be used if required, however.

The condensation polymerization of alkylene oxides onto an initiator containing an active hydrogen, such as an amine or polyol, is known to proceed under conditions of elevated temperature and pressure, and is known to be catalyzed by alkali metal hydroxides and alkoxides. Such catalysts include the preferred species NaOH and KOH.

The subject copolymers are prepared in accordance with known procedures and techniques, with the exception that if the alkaline pH buffering agent is to be generated in situ it is preferred to use as much alkali metal hydroxide or alkoxide as possible without causing a secondary reaction between the base catalyst and the copolymer product, which would result in a substantial reduction in molecular weight of the product. A concentration of about 0.2 to about 0.8 percent by weight of alkali metal hydroxide or alkoxide, based on the total weight of product, is suitable, about 0.3 to about 0.6 percent by weight being preferred. The alkaline pH buffering agent can then be conveniently generated in situ by neutralizing the alkali metal hydroxide or alkoxide catalyst with a mono- or polybasic acid after the desired molecular weight product is attained. Examples of suitable such acids include inorganic and organic acids such as $H_3PO_4$, $CO_2$, phthalic acid, and the like. Preferred acids are $H_3PO_4$ and $CO_2$. The most preferred acid is $H_3PO_4$. Accordingly, the preferred pH buffering agents are the alkali metal phosphates and alkali metal carbonates, and the most preferred agents are $Na_3PO_4$ and $K_3PO_4$.

The amine initiator may suitably be (1) a primary, secondary or tertiary alkanolamine (wherein the initiator could be regarded as being $NH_3$), (2) a primary or secondary alkyl amine (3) an alkylene polyamine or (4) a polyalkylene polyamine. The preferred amine initiators are the alkylene polyamines and the polyalkylene polyamines. Examples of suitable amine initiators include: mono- and di- methyl, ethyl, propyl, hexyl, decyl amine; mono-, di- and tri- ethanol, isopropanol, pentanol, dodecanol amine; N-methyl-N-hexylamino-4-butanol, dibutylamino-octanol; ethylenediamine, propylenediamine, 2,3-butylenediamine, hexamethylenediamine; diethylenetriamine, triethylenetetramine, tetraethylenepentamine, dipnopylenetriamine, tetrapropylenepentamine, tributylenetetramine, phenothiazine, piperazine, piperidine, pyrrolidine, aniline and other like compounds.

The amine initiator is suitably used in amounts of between about 1 and about 20 percent by weight, based on the combined weight of EO and PO, and is preferably present in amounts of about 7 to about 15 percent by weight.

The weight ratio of EO and PO moieties in the copolymer may be any that produces a water-soluble product which is liquid at about room temperature. A suitable ratio of EO to PO is between about 50/50 and 85/15, and a preferred ratio is between about 65/35 and 80/20, and a most preferred ratio is between about 70/30 and 80/20. At the higher molecular weights, a copolymer containing an EO/PO ratio of less than about 50/50, e.g. 40/60 - EO/PO, is liquid at room temperature but is decreasingly soluble in water, and at a ratio above about 85/15, e.g. 90/10 - EO/PO, the copolymer is water-soluble but becomes increasingly viscous, even to the point of becoming a soft, waxy solid. It is desirable that the copolymer be liquid at room temperature to facilitate easy handling and to avoid pump freeze-up when the apparatus designed for cleaning the circuit boards is shut down, a problem experienced with polyethylene glycol alone. The copolymer must be water-soluble to facilitate easy and rapid removal of the heat transfer agent from the circuit boards by a water wash after the excess solder is removed.

The copolymers may also contain as additives any compound known to stabilize polyoxyalkylenes at high temperatures, such as phenothiazine or oxyalkylated phenothiazine.

SPECIFIC EMBODIMENTS

The following example further illustrates the invention.

a. Preparation

To a 10 gal. kettle was charged 16 lbs. (0.266 lb.-mole) of ethylenediamine (EDA). The EDA was heated to 75°–80°C. PO, 64 lbs. (1.1 lb.-mole), was then charged into the kettle during a 15-hour time interval during which the temperature was maintained between 80°–85°C. and pressure at 40 p.s.i.g. maximum. The reaction product was then heated to 120°C. under reduced pressure to remove volatiles.

To a 200 gal. kettle was charged 60 lbs. (0.205 lb.-mole) of above reaction product and 3 lbs. of flake KOH.

The reaction mixture was heated to about 95°C. to the kettle was then charged 765 lb. (about 16.1 lb.-mole) of a mixture of EO/PO, 75/25 by weight basis during a 20-hour interval at a temperature of about 95°C. and pressure of 40 p.s.i.g. maximum. The desired molecular weight was 3,500. The reaction product was then heated at 120°C. under reduced pressure to remove volatiles and then cooled to about 80°C. under atmospheric pressure. A theoretical amount of superphosphoric acid (105 percent) was then charged into the reaction mixture to neutralize the KOH. After 30 min. at 80°C., 0.5 percent by weight of phenothiazine, based on total weight of reaction product, was added and dissolved. The reaction product was then cooled to room temperature.

The reaction product was a liquid containing finely divided particles of potassium phosphate in suspension. The physical properties were:

Viscosity (cps): 545 at 77°F., 220 at 110°F., 95 at 150°F. Specific Gravity: 1.0477 at 77°F.
Pour Point: −26°F.; Flash Point: 485°F.
Fire Point: 490°F. Refractive Index: 1.4590 at 25°C.

b. Testing

The copolymer prepared in (a) above was tested as a heat transfer agent for the removal of excess tin-lead solder from electronic circuit boards. The copolymer was tested in the commercial apparatus— "Hydro-Squeegee— Solder Leveling Machine," Model 500 M, sold by Norfax Corporation, a Division of Lear Siegler, San Diego, Calif.

This apparatus comprises a means for heating the heat transfer agent to the desired temperature, about 400–450°F., a reservoir for such heated transfer agent, two or more spray nozzles directed to a common area from opposing sides, and a means for pumping the heated transfer agent through the nozzles. In operation, a circuit board containing excess solder is first placed within the spray area of the nozzles, then the spray is caused to pass onto and over the board surface for a length of time sufficient to melt off the excess amount of solder.

After the excess solder had been removed, the circuit boards were then generally passed through a water bath to remove any residual heat transfer agent on the boards.

The EO/PO copolymer prepared in *a* above is compared to other similar polymers in Table I below. The testing procedure was the same for each heat transfer agent.

TABLE I

| Agent | Mol. Wt. | Heat Stability | Cleaning Ability |
|---|---|---|---|
| A | 3500 | Very good | 1500 (+) circuit boards |
| B | 4000 | good | 1000 |
| C | 4000 | fair | 400 |
| D | 3700 | poor | 300 |

wherein,

A is the copolymer prepared in (a) above.

B is a commerically available, glycol-initiated poly-ethylene glycol. Marketed by The Dow Chemical Company under the trade name, "Polyethylene Glycol E-4000."

C is a glycerin initiated, 80/20 - EO/PO copolymer.

D is a commerically available alcohol-initiated EO/PO copolymer. Marketed by The Dow Chemical Company under the trade name, "Ambiflo H-1000."

Heat transfer agents A, B, C and D each contained an equivalent amount of $K_3PO_4$ or $Na_3PO_4$ and equivalent amounts of phenothiazine.

The evaluation of heat stability was based on the number of boards that could be cleaned before the heat transfer agent was objectionable because of the odor and/or smoke given off by the degraded material.

Amine-initiated copolymers similar to the above example except that no phosphate salt is present are not as stable. Amine-initiated copolymers, prepared according to the above teachings, containing a small but effective amount of an alkaline pH buffering agent are heat stable liquids which are similar in physical properties and cleaning ability to the copolymer prepared in *a* above.

We claim:

1. A heat transfer agent composition consisting essentially of (a) a normally liquid, water-soluble, amine-initiated ethylene oxide/propylene oxide copolymer having an average molecular weight of from about 1,000 to about 10,000 wherein from about 50–85 percent by weight of the copolymer is due to the ethylene oxide moiety and (b) a small but effective amount of at least one alkaline pH buffering agent to inhibit development of free acidity.

2. The composition defined in claim 1 wherein from about 60–80 percent by weight of the copolymer is due to the ethylene oxide moiety.

3. The composition defined in claim 1 wherein from about 70–80 percent by weight of the copolymer is due to the ethylene oxide moiety.

4. The composition defined by claim 1 wherein *a* has an average molecular weight of from about 1,000 to about 5,000.

5. The composition defined by claim 4 wherein *a* has an average molecular weight of from about 2,500 to about 4,000.

6. The composition defined by claim 1 wherein *b* is an alkali metal carbonate, phosphate, borate, acetate, propionate, oxalate, malonate, succinate, phthalate, citrate or tartrate.

7. The composition defined by claim 1 wherein *b* is an alkali metal carbonate or phosphate.

8. The composition defined by claim 7 wherein *b* is $Na_3PO_4$ or $K_3PO_4$.

9. The composition defined by claim 1 wherein *b* is present in amounts up to about 5 percent by weight, total weight basis.

10. The composition defined by claim 3 wherein *b* is potassium phosphate and is present in an amount of from about 0.4 to 0.5 percent by weight, total weight basis.

11. The composition defined by claim 7 where *b* is present in amounts up to about 5 percent by weight, total weight basis.

12. The composition defined by claim 1 wherein *b* is present in amounts up to about 5 percent by weight, total weight basis, and is sodium phosphate or potassium phosphate.

* * * * *